United States Patent [19]
Jang et al.

[11] Patent Number: 6,121,111
[45] Date of Patent: Sep. 19, 2000

[54] METHOD OF REMOVING TUNGSTEN NEAR THE WAFER EDGE AFTER CMP

[75] Inventors: Syun-Ming Jang; Chen-Hua Yu; Shwangming Jeng, all of Hsin-chu, Taiwan

[73] Assignee: Taiwan Semiconductor Manufacturing Company, Hsin-Chu, Taiwan

[21] Appl. No.: 09/234,093

[22] Filed: Jan. 19, 1999

[51] Int. Cl.[7] .......................... H01L 21/76; H01L 21/301; H01L 21/44; H01L 23/544; G03C 5/00
[52] U.S. Cl. .......................... 438/401; 438/462; 438/685; 438/738; 257/797; 430/313; 430/317
[58] Field of Search .................................... 438/462, 401, 438/424, 685, 725, 738, 751; 257/797; 430/313, 317

[56] References Cited

U.S. PATENT DOCUMENTS

| 5,271,798 | 12/1993 | Sandhu et al. | 156/638 |
|---|---|---|---|
| 5,614,446 | 3/1997 | Ramaswami et al. | 437/228 |
| 5,640,053 | 6/1997 | Caldwell | 257/797 |
| 5,705,320 | 1/1998 | Hsu et al. | 430/313 |
| 5,899,738 | 5/1999 | Wu et al. | 438/618 |
| 5,956,596 | 9/1999 | Jang et al. | 438/401 |
| 6,017,662 | 1/2000 | Lee | 430/30 |
| 6,043,133 | 3/2000 | Jang et al. | 438/401 |

Primary Examiner—Jey Tsai
Assistant Examiner—Ha Tran Nguyen
Attorney, Agent, or Firm—George O. Saile; Stephen B. Ackerman; Larry J. Prescott

[57] ABSTRACT

A method is described for removing residual metal, such as tungsten, from the edge region of a wafer. After tungsten is deposited on a wafer to fill via holes in a dielectric the wafer is planarized using Chemical Mechanical Polishing, CMP. The CMP does not remove the tungsten from the edge of the wafer. After conductor metals for a layer of conducting electrodes has been deposited a layer of photoresist is formed on the wafer and patterned to clear the metals from over the alignment marks. This photoresist is then removed from the edge region of the wafer. The residual metals are then etched away from the edge region of the wafer using the remaining photoresist as a mask during the same etching step used to remove metals from the alignment marks or during a separate etching step. In one embodiment the alignment marks and laser marks are relocated to the edge region of the wafer and the residual metals are etched away from the edge region of the wafer during the same etching step used to remove metals from the alignment marks and laser marks.

20 Claims, 6 Drawing Sheets

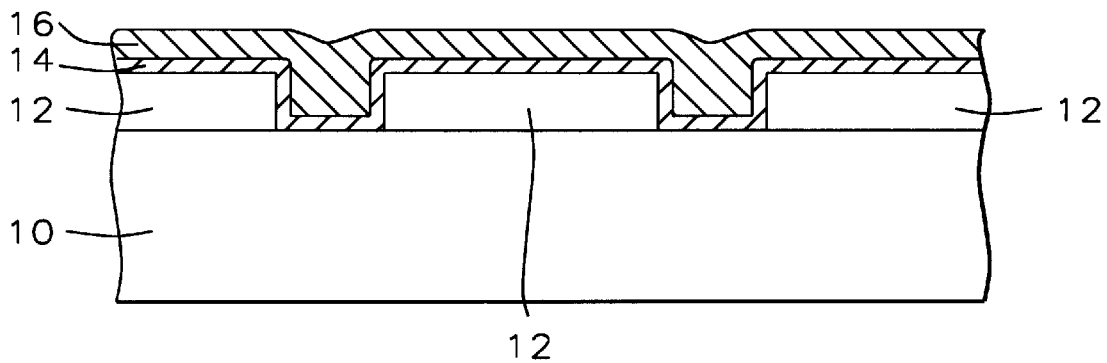
FIG. 1 – Prior Art
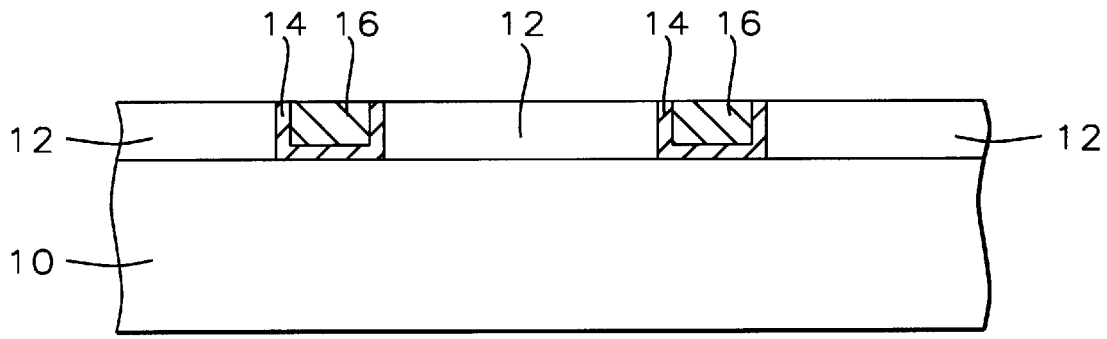
FIG. 2 – Prior Art
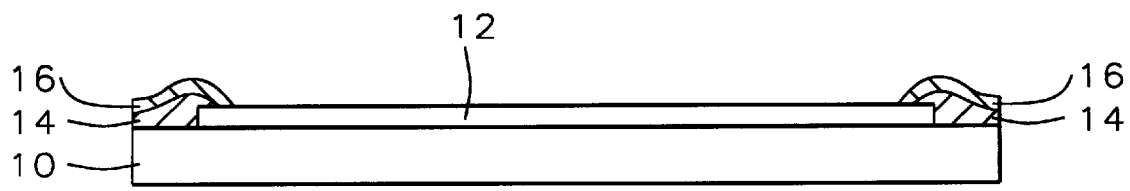
FIG. 3 – Prior Art

METHOD OF REMOVING TUNGSTEN NEAR THE WAFER EDGE AFTER CMP

BACKGROUND OF THE INVENTION

(1) Field of the Invention

This invention relates to methods for removing residual tungsten at the edge of an integrated circuit wafer after planarizing the wafer using chemical mechanical polishing, CMP, which leaves a tungsten residue at the wafer edge.

(2) Description of the Related Art

In integrated circuit fabrication it is necessary to form via holes in an inter-level dielectric material and to fill these via holes with a conductor such as tungsten. The via holes are filled by depositing a blanket layer of tungsten and then removing that part of the tungsten not in the vias using Chemical Mechanical Polishing, CMP. One of the problems encountered in this method is that the CMP does not remove the tungsten from the edge of the wafer. This residual tungsten can flake off causing contamination problems during later process steps.

U.S. Pat. No. 5,640,053 to Caldwell shows a method of removing metal from an alignment mark area.

U.S. Pat. No. 5,705,320 to Hsu et al. describes a method for recovering alignment marks after Chemical Mechanical Polishing.

U.S. Pat. No. 5,271,798 to Sandhu et al. describes a method for removing tungsten from alignment marks on a wafer.

SUMMARY OF THE INVENTION

FIG. 1 shows a cross section view of a part of an integrated circuit wafer 10 having a layer of oxide or other dielectric 12 formed thereon with via holes formed in the oxide. A layer of titanium nitride 14 and a layer of tungsten 16 are then deposited to fill the via holes with conductor material. The titanium nitride is used to improve the adhesion of the tungsten to the oxide. Next, as shown in FIG. 2 the wafer is planarized using Chemical Mechanical Polishing, CMP, removing the tungsten and titanium nitride except for the tungsten 16 and titanium nitride 14 filling the via holes in the oxide 12 and at the outer edge of the wafer 10. The problem is shown schematically in FIG. 3 showing a tungsten 16 and titanium nitride 14 residue at the outer edge of the wafer 10.

It is a principle objective of this invention to provide a method of removing the tungsten, titanium nitride, and/or residues of other conductors from the outer edge of the wafer.

This objective is achieved by utilizing the photoresist used as a mask to clear out metals from the alignment region of the wafer. This photoresist is removed from the edge of the wafer during a wafer edge rinse exposing the residual tungsten. The residual tungsten is then etched away either at the same time metal is cleared from the alignment mark region of the wafer or during a separate etching step.

This objective can also be achieved by relocating the alignment marks and the laser marks to the edge of the wafer. A layer of photoresist is then formed on the wafer and removed from the wafer edge by photolithography or using an edge rinse. The tungsten can then be removed from the edge of the wafer, the alignment marks, and the laser marks simultaneously.

BRIEF DESCRIPTION OF THE DRAWINGS

FIG. 1 shows a cross section view of a part of an integrated circuit wafer showing a layer of oxide with via holes, a layer of titanium nitride, and a layer of tungsten.

FIG. 2 shows a cross section view of the part of the integrated circuit wafer shown in FIG. 1 after CMP leaving tungsten and titanium nitride in the via holes.

FIG. 3 shows a cross section view of the wafer after CMP showing tungsten and titanium nitride residue at the edge of the wafer.

DESCRIPTION OF THE PREFERRED EMBODIMENTS

Figure 4A:
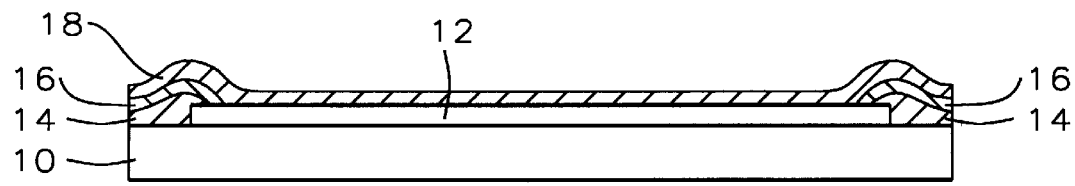
FIG. 4A shows a cross section view of the wafer shown in FIG. 3 showing a layer of second titanium nitride formed on the wafer.

Refer now to FIGS. 1–9B for a description of the preferred embodiment of the method of this invention for removing metal residue from the edge of a wafer. As shown in FIG. 1 a layer of dielectric 12, such as silicon oxide, is formed on an integrated circuit wafer 10 and via holes are formed in the layer of dielectric. A conducting adhesion layer 14, such as a layer of first titanium nitride 14, is then deposited on the wafer covering the sidewalls and bottoms of the via holes. Next a layer of conductor material 16, such as tungsten, is formed on the wafer filling the via holes. Next, as shown in FIG. 2 the wafer is planarized using Chemical Mechanical Polishing, CMP, removing the tungsten and titanium nitride except for the tungsten 16 and titanium nitride 14 filling the via holes in the oxide 12. As shown in FIG. 3 the CMP planarization leaves a metal residue, in this example tungsten 16 and titanium nitride 14 at the edge of the wafer. If this metal residue is not removed particles can flake off during subsequent processing steps and cause contamination problems.

Figure 4B:
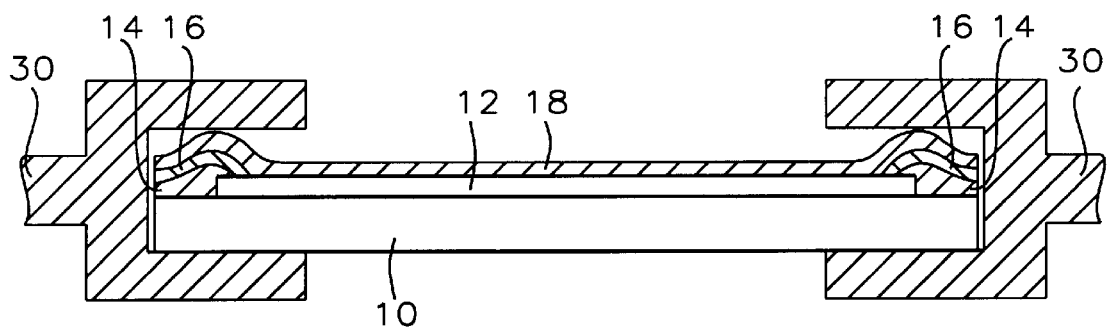
FIG. 4B shows a cross section view of the wafer shown in FIG. 3 showing the clamp used for depositing a layer of aluminum copper.
Figure 4C:
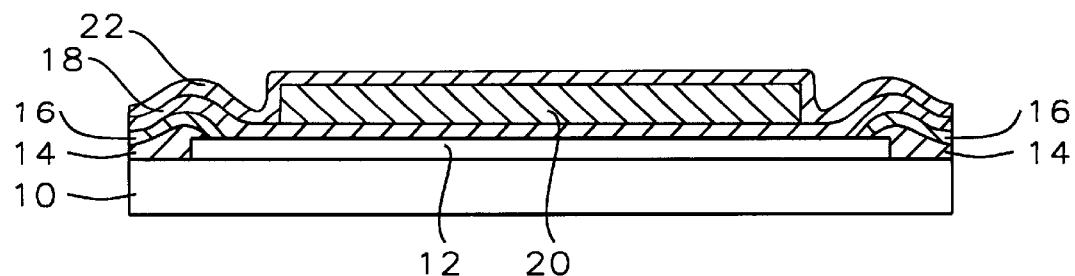
FIG. 4C shows a cross section view of the wafer shown in FIG. 3 the layer of aluminum copper formed on the layer of second titanium nitride and a layer of third titanium nitride formed on the layer of aluminum copper.

Next a layer of conductor material is to be deposited on the dielectric and filled via holes in order to form a level of conducting electrodes. As shown in FIG. 4A a conducting adhesion layer 18, such as a layer of second titanium nitride is formed on the wafer. As shown in FIG. 4B the wafer is then placed in a clamp 30 for the deposition of a layer of conducting material, in this example a layer of aluminum copper. The clamp 30 prevents the aluminum copper from depositing at the edge of the wafer. Next as shown in FIG. 4C another conducting adhesion layer 22, in this example a layer of third titanium nitride, is formed on the layer of aluminum copper 20.

Figure 5:
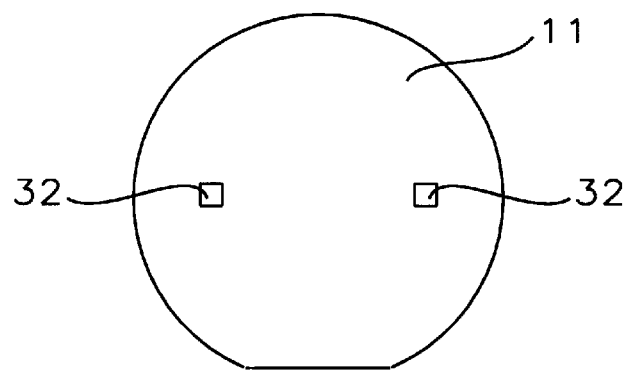
FIG. 5 shows a top view of a wafer showing the location of alignment regions.
Figure 6A:
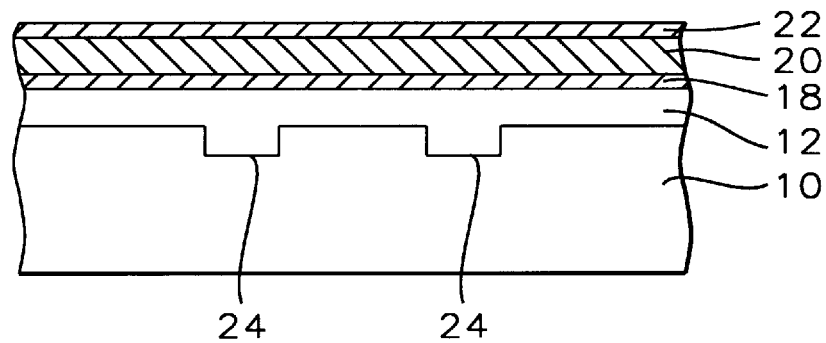
FIG. 6A shows a cross section view of the alignment region of a wafer after CMP and the deposition of a first layer of titanium nitride, a layer of aluminum copper, and a second layer of titanium nitride.
Figure 6B:
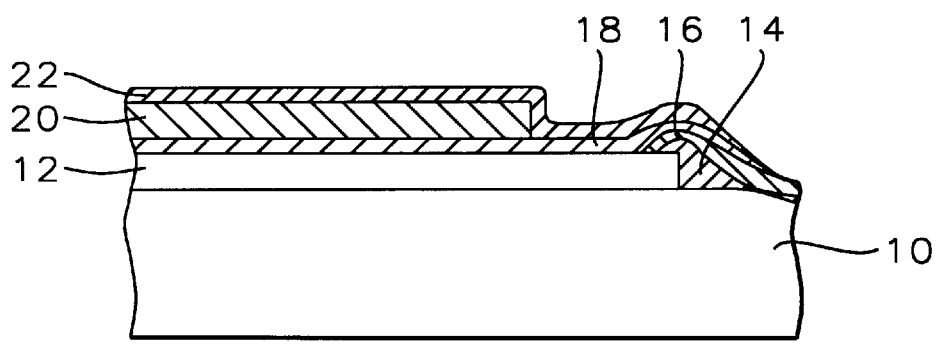
FIG. 6B shows a cross section view of the edge of a wafer after CMP and the deposition of a first layer of titanium nitride, a layer of aluminum copper, and a second layer of titanium nitride.
Figure 6C:
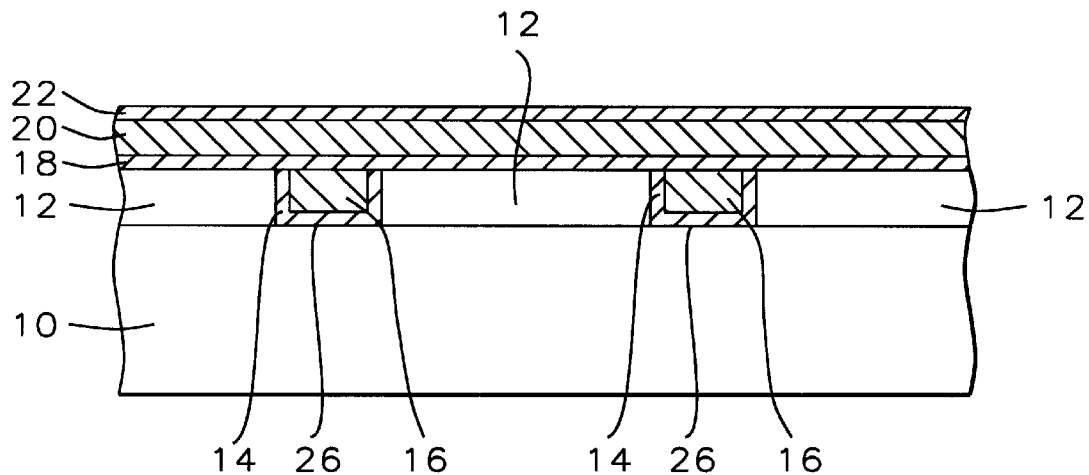
FIG. 6C shows a cross section view of a region of a wafer having via holes filled with titanium nitride and tungsten after CMP and the deposition of a first layer of titanium nitride, a layer of aluminum copper, and a second layer of titanium nitride.

FIG. 5 shows a top view of a wafer 11 showing the location of alignment regions 32 on the wafer 11. FIG. 6A shows a cross section of a part of one of the alignment regions showing the alignment marks 24 covered by the layer of oxide 12, the layer of second titanium nitride 18, the layer of aluminum copper 20, and the layer of second titanium nitride 22. FIG. 6B shows a cross section view of the edge of the wafer 10 showing the layer of oxide 12, the first titanium residue 14, the tungsten residue 16, the layer of second titanium nitride 18, the layer of aluminum copper 20, and the layer of third titanium nitride 22. FIG. 6C shows a cross section view of a region of the wafer 10 having via holes 26 formed in the layer of oxide 12, first titanium 14 and tungsten 16 in the via holes 26, the layer of second titanium nitride 18, the layer of aluminum copper 20, and the layer of third titanium nitride 22.

Figure 7A:
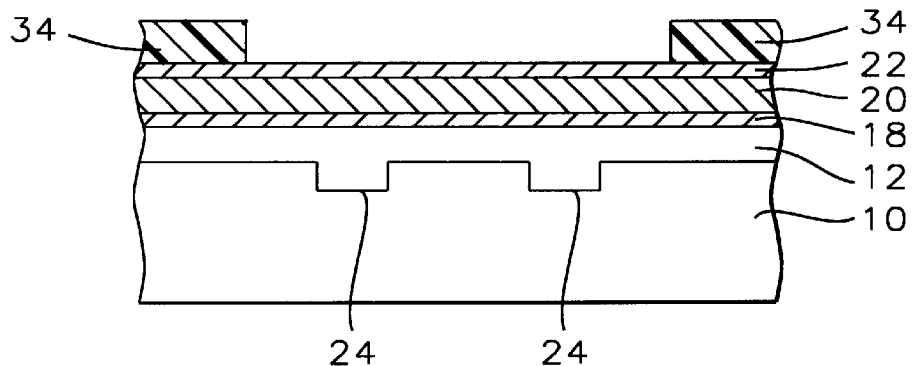
FIG. 7A shows a cross section view of the alignment region of a wafer after a photoresist mask has been formed to clear the titanium nitride and aluminum copper from the alignment region.
Figure 7B:
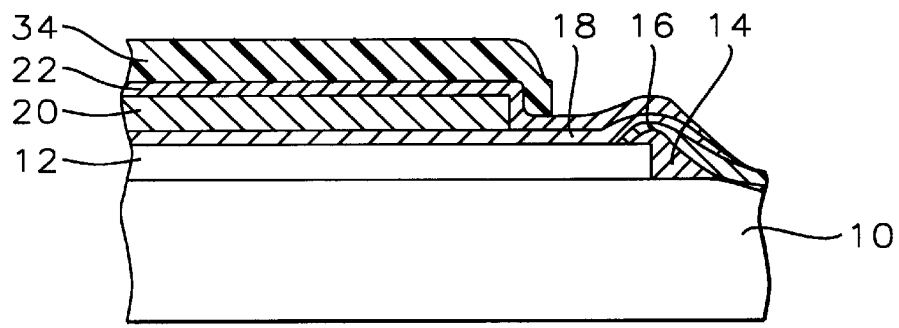
FIG. 7B shows a cross section view of the edge of a wafer after the photoresist used in the clearout of the alignment region has been removed from the edge of the wafer.

The key parts of the method of this invention will now be described. As shown in FIG. 6A, the alignment marks are obscured by the conductor metal layers, the layer of second titanium nitride 18, the layer of aluminum copper 20, and the layer of third titanium nitride 22. In order to pattern the conductor metal layers the conductor metals must be cleared from the alignment region so that the alignment marks become visible and can be used for mask alignment. In order to clear the alignment region a layer of photoresist 34 is formed on the wafer and patterned, using standard photolithographic methods, to form a mask to etch away the conductor metals from the alignment region of the wafer, see FIG. 7A. In the method of this invention, as shown in FIG. 7B, the photoresist is also removed from the edge region of the wafer in order to remove the residual metal from the edge of the wafer.

Figure 8:
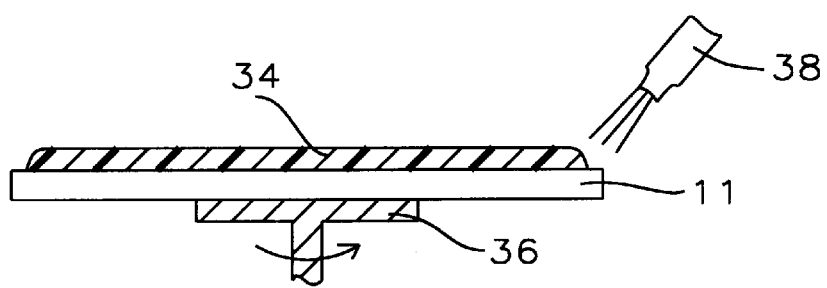
FIG. 8 shows a schematic view of an apparatus used to remove photoresist from the edge of a wafer.

The photoresist 34 is removed from the edge region of the wafer by an edge rinse. As shown in FIG. 8, this edge rinse can be accomplished by directing a stream of solvent 40, such as an amine based organic solvent, from a nozzle 38 onto the edge region of a wafer 11. The wafer 11 is held by a wafer holder 36 and rotated, as indicated by the arrow, so that the solvent removes photoresist from the entire edge region.

Figure 9A:
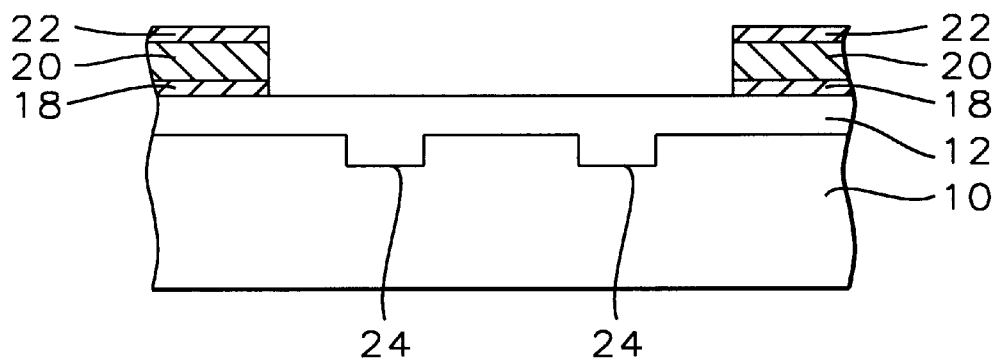
FIG. 9A shows a cross section view of the alignment region of a wafer after the titanium nitride and aluminum copper have been removed from the alignment region.
Figure 9B:
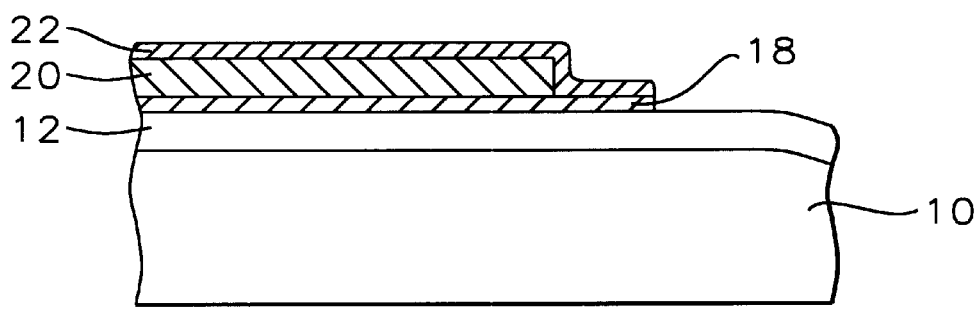
FIG. 9B shows a cross section view of the edge of a wafer after titanium nitride and tungsten residue have been removed from the edge of the wafer.

As shown in FIG. 9A, the second titanium nitride 18, aluminum copper 20, and the third titanium nitride 22 are etched away from that part of the alignment region directly over the alignment marks 24 using dry anisotropic etching, an etchant such as $BCl_3/Cl_2/N_2$, and the patterned photoresist as a mask. As shown in FIG. 9B, the residual first titanium nitride, tungsten, second titanium nitride, and third titanium nitride are etched away from the edge region of the wafer using dry anisotropic etching, etchants such as $BCl_3/Cl_2/N_2$ for etching titanium nitride and $SF_6/Cl_2/N_2$ for etching tungsten, and the remaining photoresist as a mask. After the removal of these conductor metals from the alignment region and from the edge region the remaining photoresist is stripped as shown in FIGS. 9A and 9B. It is not necessary to remove the aluminum copper from the edge region because the clamp used to hold the wafer during the deposition of the aluminum copper prevents deposition of aluminum copper on the edge region of the wafer.

Figure 10:
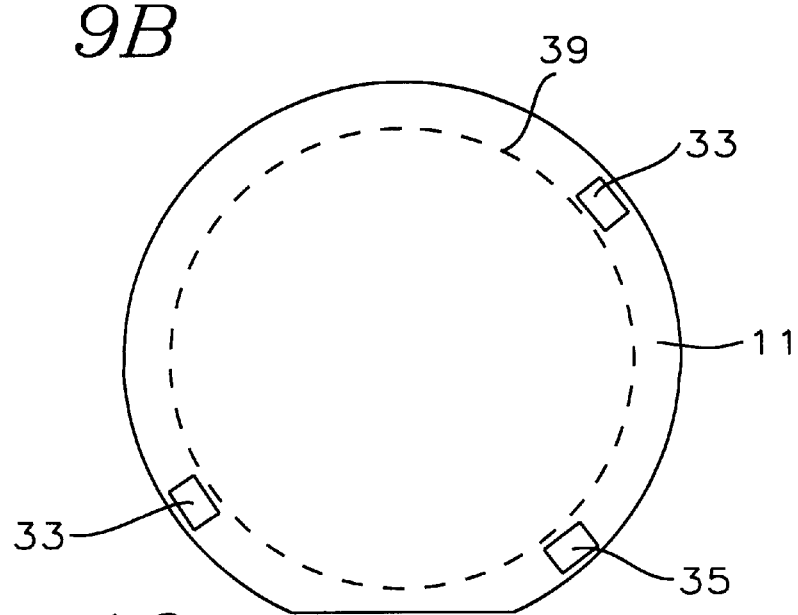
FIG. 10 shows a top view of a wafer showing the alignment marks and laser marks moved to the edge of the wafer.

Refer now to FIGS. 1–4C, 6B, 7B, 8, 9B, and 10 for another embodiment of the method of this invention for removing residual metal from the edge of the wafer. In this embodiment the alignment marks 33 and the laser marks 35 are moved to the edge region of the wafer 11, as shown in FIG. 10. The dashed line 39 in FIG. 10 shows the location of the clamp used to hold the wafer during the deposition of aluminum copper so that there will be no aluminum copper deposited between the dashed line 39 and the edge of the wafer.

As shown in FIG. 1 a layer of dielectric 12, such as silicon oxide, is formed on an integrated circuit wafer 10 and via holes are formed in the layer of dielectric. A conducting adhesion layer 14, such as a layer of first titanium nitride 14, is then deposited on the wafer covering the sidewalls and bottoms of the via holes. Next a layer of conductor material 16, such as tungsten, is formed on the wafer filling the via holes. Next, as shown in FIG. 2 the wafer is planarized using Chemical Mechanical Polishing, CMP, removing the tungsten and titanium nitride except for the tungsten 16 and titanium nitride 14 filling the via holes in the oxide 12 and at the edge of the wafer 10. As shown in FIG. 3 the CMP planarization leaves a metal residue, in this example tungsten 16 and titanium nitride 14 at the edge of the wafer.

Next, as shown in FIG. 4A a conducting adhesion layer 18, such as a layer of second titanium nitride is formed on the wafer. As shown in FIG. 4B the wafer is then placed in a clamp 30 for the deposition of a layer of conducting material, in this example a layer of aluminum copper. The clamp 30 prevents the aluminum copper from depositing at the edge of the wafer. Next as shown in FIG. 4C another conducting adhesion layer 22, in this example a layer of third titanium nitride, is formed on the layer of aluminum copper 20. FIG. 6B shows a cross section view of the edge of the wafer 10 showing the layer of oxide 12, the first titanium residue 14, the tungsten residue 16, the layer of second titanium nitride 18, the layer of aluminum copper 20, and the layer of third titanium nitride 22.

As shown in FIG. 10, the alignment marks 33 and the laser marks 35 are moved to the edge region of the wafer 11, as shown in FIG. 10. The dashed line 39 in FIG. 10 shows the location of the clamp used to hold the wafer during the deposition of aluminum copper so that there will be no aluminum copper deposited over the alignment marks 33 and the laser marks 35. A layer of photoresist is then formed on the wafer. Next, as shown in FIG. 7B, the photoresist 34 is removed from the edge region of the wafer.

The photoresist 34 is removed from the edge region of the wafer either by standard photolithographic processing or by an edge rinse. As shown in FIG. 8, this edge rinse can be accomplished by directing a stream of solvent 40, such as an amine based organic solvent, from a nozzle 38 onto the edge region of a wafer 11. The wafer 11 is held by a wafer holder 36 and rotated, as indicated by the arrow, so that the solvent removes photoresist from the entire edge region.

Next, as shown in FIG. 9B, the residual first titanium nitride, tungsten, second titanium nitride, and third titanium nitride are etched away from the edge region of the wafer using dry anisotropic etching, etchants such as $BCl_3/Cl_2/N_2$ for etching titanium nitride and any aluminum copper present and $SF_6/Cl_2/N_2$ for etching tungsten, and the remaining photoresist as a mask. The remaining photoresist is then stripped. This also removes residual metals from the edge region of the wafer and clears the metals from the alignment marks and laser marks so they can be used for alignment for subsequent processing steps. The removal of the residual metals from the wafer edge and the alignment marks and laser marks is accomplished without requiring additional processing steps.

While the invention has been particularly shown and described with reference to the preferred embodiments thereof, it will be understood by those skilled in the art that various changes in form and details may be made without departing from the spirit and scope of the invention.

What is claimed is:

1. A method of removing tungsten from the edge of a wafer, comprising:
    providing a wafer having an outer edge, active regions, alignment regions, and alignment marks, wherein said alignment masks are located in said alignment regions;
    providing a layer of dielectric material, having a top surface and a plurality of via holes formed therein, on said wafer, thereby covering said alignment marks with said dielectric material;
    depositing a layer of first conductor material on said layer of dielectric material thereby filling said via holes with said first conductor material;
    planarizing said wafer using chemical mechanical polishing thereby removing said first conductor material from said top surface of said layer of dielectric material and leaving said first conductor material in said via holes and at said outer edge of said wafer;
    depositing a layer of second conductor material on said wafer after planarizing said wafer using a means whereby none of said second conductor material is deposited on said outer edge of said wafer;
    forming a layer of photoresist on said wafer after depositing said layer of second conductor material;
    patterning said layer of photoresist thereby removing said photoresist from said alignment region of said wafer;
    removing said photoresist from said outer edge of said wafer;
    etching away said second conductor material from said alignment region of said wafer after patterning said layer of photoresist;
    etching away said first conductor material from said outer edge of said wafer after removing said photoresist from said outer edge of said wafer; and
    removing the remaining said photoresist from said wafer.

2. The method of claim 1 wherein said first conductor material comprises tungsten.

3. The method of claim 1 wherein said first conductor material comprises a titanium nitride and tungsten.

4. The method of claim 1 wherein said second conductor material comprises aluminum copper.

5. The method of claim 1 wherein said depositing a layer of second conductor material on said wafer comprises the use of a clamp holding said wafer so that part of said clamp covers said outer edge of said wafer.

6. The method of claim 1 wherein said removing said photoresist from said outer edge of said wafer is accomplished using an edge rinse of said wafer.

7. The method of claim 1 wherein said etching away said second conductor material from said alignment region of said wafer and said etching away said first conductor material from said outer edge of said wafer are accomplished during the same etching step.

8. The method of claim 1 wherein said etching away said second conductor material from said alignment region of said wafer uses dry anisotropic etching.

9. The method of claim 1 wherein said etching away said first conductor material from said outer edge of said wafer uses dry anisotropic etching.

10. The method of claim 1 further comprising:
    depositing a layer of third conductor material on said wafer after planarizing said wafer and before depositing said layer of second conductor material on said wafer;
    depositing a layer of fourth conductor material on said wafer after depositing said layer of second conductor material on said wafer; and
    etching away said third conductor material and said fourth conductor material from said outer edge of said wafer using the same etching step used for said etching away said first conductor material from said outer edge of said wafer.

11. The method of claim 10 wherein said third conductor material and said fourth conductor material are titanium nitride.

12. A method of removing tungsten from the edge of a wafer, comprising:
    providing a wafer having an outer edge, an outer region, active regions, alignment marks, and laser marks, wherein said alignment masks and said laser marks are located in said outer region and said outer region is that part of said wafer within a first distance from said outer edge of said wafer;
    providing a layer of dielectric material, having a top surface and a plurality of via holes formed therein, on said wafer, thereby covering said alignment marks and said laser marks with said dielectric material;
    depositing a layer of first conductor material on said layer of dielectric material thereby filling said via holes and covering said alignment marks and said laser marks with said first conductor material;
    planarizing said wafer using chemical mechanical polishing thereby removing said first conductor material from said top surface of said layer of dielectric material and leaving said first conductor material in said via holes and on said outer region of said wafer;
    depositing a layer of second conductor material on said wafer after planarizing said wafer using a means whereby none of said second conductor material is deposited on said outer region of said wafer;
    forming a layer of photoresist on said wafer after depositing said layer of second conductor material;
    removing said photoresist from said outer region of said wafer thereby forming a photoresist mask;
    etching away said first conductor material from said outer region of said wafer using said photoresist mask thereby removing said first conductor material from said alignment marks and said laser marks; and
    removing the remaining said photoresist from said wafer.

13. The method of claim 12 wherein said first conductor material comprises a layer of tungsten.

14. The method of claim 12 wherein said first conductor material comprises a layer of titanium nitride and a layer of tungsten.

15. The method of claim 12 wherein said second conductor material comprises a layer of aluminum copper.

16. The method of claim 12 wherein said depositing a layer of second conductor material on said wafer comprises the use of a clamp holding said wafer so that part of said clamp covers said outer region of said wafer.

17. The method of claim 12 wherein said removing said photoresist from said outer region of said wafer is accomplished using an edge rinse of said wafer.

18. The method of claim 12 wherein said etching away said first conductor material from said outer region of said wafer uses dry anisotropic etching.

19. The method of claim 12 further comprising:

depositing a layer of third conductor material on said wafer after planarizing said wafer and before depositing said layer of second conductor material on said wafer;

depositing a layer of fourth conductor material on said wafer after depositing said layer of second conductor material on said wafer; and etching away said third conductor material and said fourth conductor material from said outer region of said wafer using the same etching step used for said etching away said first conductor material from said outer region of said wafer.

20. The method of claim 19 wherein said third conductor material and said fourth conductor material are titanium nitride.

* * * * *